(12) United States Patent
Leng et al.

(10) Patent No.: US 12,048,122 B2
(45) Date of Patent: Jul. 23, 2024

(54) POWER MODULE AND POWER DEVICE

(71) Applicant: NIKO SEMICONDUCTOR CO., LTD., New Taipei (TW)

(72) Inventors: Chung-Ming Leng, New Taipei (TW); Chih-Cheng Hsieh, Taoyuan (TW); Wei-Lun Wang, New Taipei (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 215 days.

(21) Appl. No.: 17/941,194

(22) Filed: Sep. 9, 2022

(65) Prior Publication Data

US 2023/0225087 A1   Jul. 13, 2023

(30) Foreign Application Priority Data

Jan. 12, 2022 (TW) .................................. 111101225

(51) Int. Cl.
*H05K 7/20* (2006.01)
*H05K 1/02* (2006.01)

(52) U.S. Cl.
CPC ....... *H05K 7/20418* (2013.01); *H05K 1/0203* (2013.01); *H05K 7/20509* (2013.01)

(58) Field of Classification Search
CPC . H01L 23/4006; H01L 23/40; H01L 23/4093; H01L 2023/405; H01L 2924/13091; H01L 23/36; H05K 1/181; H05K 1/0203; H05K 7/20509; H05K 7/20418; H05K 7/209; H05K 7/2039; H05K 7/20; H05K 2201/066; H05K 7/20409; H05K 7/20436; H05K 2201/10409
See application file for complete search history.

(56) References Cited

U.S. PATENT DOCUMENTS

| | | | |
|---|---|---|---|
| 7,272,006 B2 * | 9/2007 | Mongia ................. | H01L 23/473 257/E23.098 |
| 2007/0070603 A1 * | 3/2007 | Park ..................... | H01L 23/473 257/E23.098 |
| 2007/0076374 A1 * | 4/2007 | Mongia ................. | H01L 23/473 257/E23.098 |
| 2007/0147001 A1 * | 6/2007 | Lin ...................... | H01L 23/4006 257/E23.084 |
| 2007/0236888 A1 * | 10/2007 | Eckberg .............. | H01L 23/4006 361/704 |

(Continued)

*Primary Examiner* — Adam B Dravininkas
(74) *Attorney, Agent, or Firm* — Li & Cai Intellectual Property (USA)

(57) ABSTRACT

A power module and a power device are provided. The power device includes two screws, a heat dissipation components and a power module. The power module includes a substrate, a package body and two fixing structures. Each fixing structure includes a first through hole, two second through holes, an annular structure and two sinking structures. When the power module is fixed to the heat dissipation component, each sinking structure is bent toward the heat dissipation component, and each annular structure is fixed to the flat surface of the heat dissipation component by the screws. The heat dissipation surface of the substrate can be flatly attached to the flat surface of the heat dissipation component through the two fixed structures, so that the heat energy generated during the operation of the power module can be transferred out through the heat dissipation component.

15 Claims, 11 Drawing Sheets

(56) References Cited

U.S. PATENT DOCUMENTS

| | | | | |
|---|---|---|---|---|
| 2008/0218978 A1* | 9/2008 | Ogawa | ............... | H01L 23/4006 |
| | | | | 257/E23.084 |
| 2009/0308573 A1* | 12/2009 | Sun | .................... | H01L 23/3672 |
| | | | | 165/80.3 |
| 2011/0090649 A1* | 4/2011 | Chan | .................... | H01L 23/467 |
| | | | | 361/709 |
| 2016/0057891 A1* | 2/2016 | Chang | .................... | B23P 15/26 |
| | | | | 29/890.03 |
| 2020/0286810 A1* | 9/2020 | Espin | .................... | H05K 3/301 |

\* cited by examiner

POWER MODULE AND POWER DEVICE

CROSS-REFERENCE TO RELATED PATENT APPLICATION

This application claims the benefit of priority to Taiwan Patent Application No. 111101225, filed on Jan. 12, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power module and a power device, and more particularly to a power module and a power device suitable for application in high power.

BACKGROUND OF THE DISCLOSURE

In the related art, a large amount of heat energy is generated by a conventional high-power power module during operation, so that a heat dissipation component must be connected to one side of the power module so as to outwardly transfer the large amount of heat energy generated by the power module. Generally speaking, this kind of power module can be fixed to the heat dissipation component by means of screws. In practice, the power module that is fixed to the heat dissipation component with the screws cannot efficiently use the heat dissipation component to outwardly transfer the large amount of heat energy generated by the power module due to various factors (such as the inability of screws to effectively connect the power modules to the heat dissipation components, etc.).

SUMMARY OF THE DISCLOSURE

In response to the above-referenced technical inadequacy, the present disclosure provides a power module and a power device, which are mainly used to improve the conventional power module. When the screws are used to fix the power module on the heat dissipation component, the heat dissipation surface of the power module cannot be effectively flatly attached to the surface of the heat dissipation component, so that a large amount of heat energy generated during the operation of the power module cannot be effectively transferred through the heat dissipation component.

In one aspect, the present disclosure provides a power module, which includes a substrate, a package body, a plurality of pins, and two fixing structures. A side of the substrate is provided with at least one electronic component, and another side of the substrate is a heat dissipation surface. The package body is used for covering the side of the substrate that is provided with the at least one electronic component, and the heat dissipation surface is exposed from the package body. An end of each of the pins is fixed to the substrate, and another end of each of the pins passes through the package body. The two fixing structures are respectively disposed at two opposite sides of the package body, and each of the two fixing structures includes a first through hole, at least two second through holes, an annular structure, and two sinking structures. The first through hole passes through the fixing structure. The at least two second through holes passes through the fixing structure. The at least two second through holes are centered on the first through hole and are respectively located beside two sides of the first through hole, the at least two second through holes face each other, and each of the two second through holes is arc-shaped. The annular structure is disposed among the at least two second through holes and the first through hole. The two sinking structures are respectively disposed on two sides of the annular structure. Each of the sinking structures is connected to the annular structure, and one of the two sinking structures is disposed between an end of one of the two second through holes and an end of another one of the two second through holes. Therefore, when the power module is fixed to a heat dissipation component by two screws, a stud portion of each of the screws passes through the corresponding first through hole, and a head portion of each of the screws presses against the corresponding annular structure, so that the annular structure is flatly attached to a flat surface of the heat dissipation component.

In another aspect, the present disclosure provides a power module, which includes a substrate, a package body, a plurality of pins, and two fixing structures. A side of the substrate is provided with at least one electronic component, and another side of the substrate is a heat dissipation surface. The package body is used for covering the side of the substrate that is provided with the at least one electronic component, and the heat dissipation surface is exposed from the package body. An end of each of the pins is fixed to the substrate, and another end of each of the pins passes through the package body. The two fixing structures are respectively disposed at two opposite sides of the package body, and each of the two fixing structures includes a first through hole, a second through holes, an annular structure, and a sinking structure. The first through hole passes through the fixing structure. The second through holes passes through the fixing structure. The second through hole is arc-shaped, and the second through hole is centered on the first through hole and is arranged around a part of a periphery of the first through hole. The annular structure is disposed between the second through hole and the first through hole. The sinking structure is disposed on a side of the annular structure. The sinking structure is disposed between the package body and the first through hole, and the sinking structure is connected to the annular structure. Therefore, when the power module is fixed to a heat dissipation component by two screws, a stud portion of each of the screws passes through the corresponding first through hole, and a head portion of each of the screws presses against the corresponding annular structure, so that the annular structure is flatly attached to a flat surface of the heat dissipation component.

In yet another aspect, the present disclosure provides a power device, in which includes a heat dissipation component, two screws and a power module. The power module includes a substrate, a package body, a plurality of pins, and two fixing structures. A side of the substrate is provided with at least one electronic component, and another side of the substrate is a heat dissipation surface. The package body is used for covering the side of the substrate that is provided with the at least one electronic component, and the heat dissipation surface is exposed from the package body. An end of each of the pins is fixed to the substrate, and another end of each of the pins passes through the package body. The two fixing structures are respectively disposed at two opposite sides of the package body, and each of the two fixing structures includes a first through hole, at least two second through holes, an annular structure, and two sinking structures. The first through hole passes through the fixing structure. The at least two second through holes passes through the fixing structure. The at least two second through holes are centered on the first through hole and are respectively located beside two sides of the first through hole, the at least two second through holes face each other, and each of the two second through holes is arc-shaped. The annular structure is disposed among the at least two second through holes and the first through hole. The two sinking structures are respectively disposed on two sides of the annular structure. Each of the sinking structures is connected to the annular structure, and one of the two sinking structures is disposed between an end of one of the two second through holes and an end of another one of the two second through holes. Therefore, when the power module is fixed to the heat dissipation component by the two screws, a stud portion of each of the two screws passes through the corresponding first through hole, and a head portion of each of the screws presses against the corresponding annular structure, so that the annular structure is flatly attached to a flat surface of the heat dissipation component.

Therefore, in the power module and the power device provided by the present disclosure, when the power module is fixed to the heat dissipation component by two screws, the heat dissipation surface of the power module can be flatly attached to a flat surface of the heat dissipation component by virtue of the first through hole, the second through hole, the annular structure and the two sinking structures of each of the two fixing structures, so that a large amount of heat energy generated during the operation of the power module can be effectively transferred out through the heat dissipation component.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, the present disclosure provides a power device 100 including a heat dissipation component 1 (such as a heat sink), two screws 2 and a power module 3. The heat dissipation component 1 has a flat surface 11 and two screw holes 12 formed on one side thereof, and for example, the heat dissipation component 1 has a plurality of heat dissipation fins 13 disposed on another side thereof. The specific appearance of the heat dissipation component 1 is not limited to what is shown in the drawings. The heat dissipation component 1 is mainly used to dissipate the heat energy that is generated during the operation of the power device 100. The two screw holes 12 are used for locking the two screws 2, so as to fix the power module 3 on the flat surface 11 of the heat dissipation component 1.

It should be noted that a large amount of heat energy will be generated during the operation of the power module 3, so that whether the power module 3 and the heat dissipation component 1 are closely connected will directly affect the operation efficiency of the power module 3. That is to say, if the power module 3 is not closely connected with the heat dissipation component 1, the large amount of heat energy generated during the operation of the power module 3 will not be effectively transferred to the outside of the power module 3, thereby the operation efficiency of the power module 3 will be directly affected, and the power module 3 may even be destroyed. When the power module 3 is fixed to the heat dissipation component 1 by the two screws 2 due to the design of two fixing structures 35, the power module 3 can be in close contact with the heat dissipation component 1, so that the large amount of heat energy generated during the operation of the power module 3 can be smoothly transferred through the heat dissipation component 1 so as to improve the operation efficiency of the power module 3.

Figure 1:
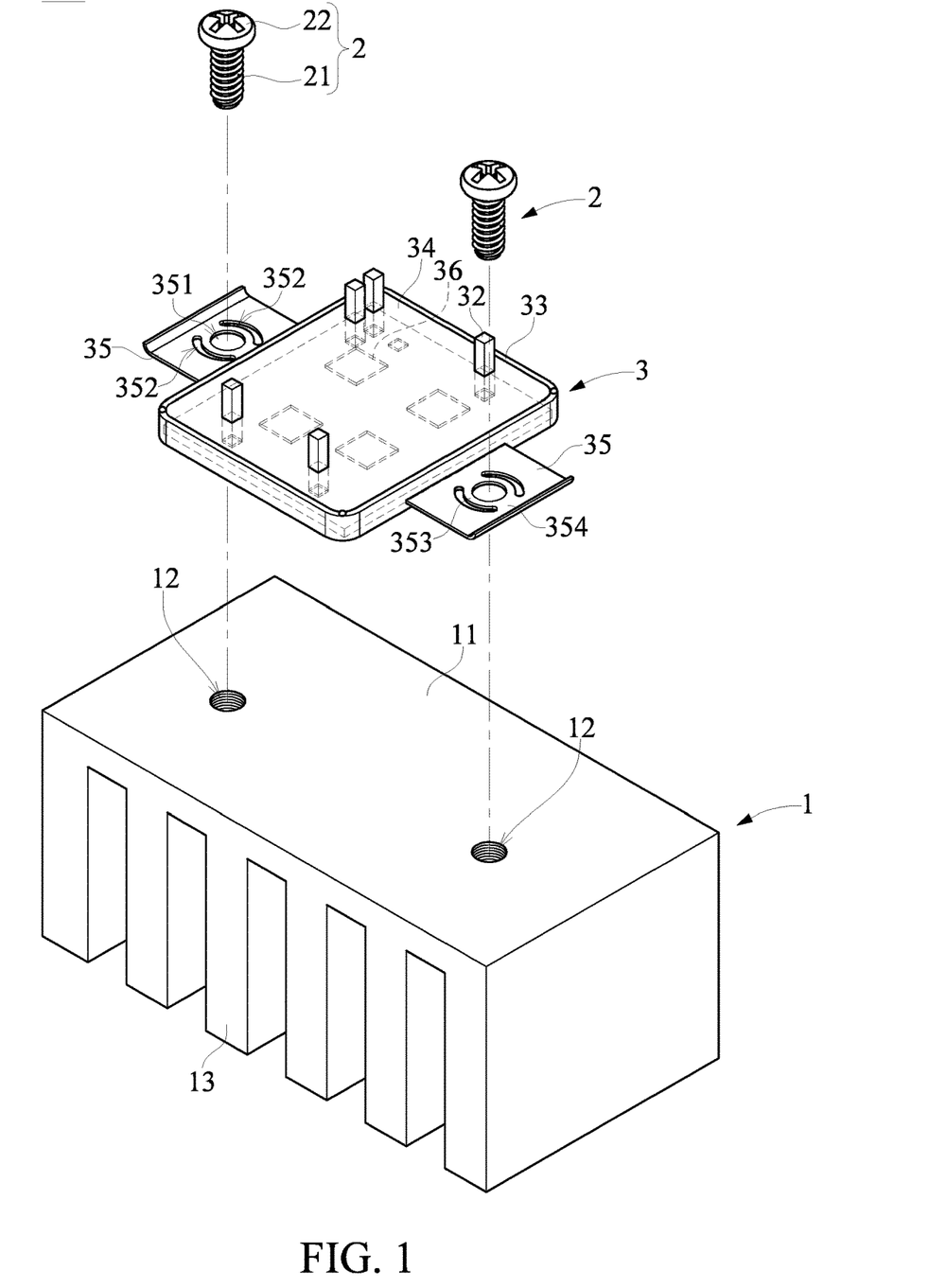
FIG. 1 is a schematic perspective exploded view of a power device according to the present disclosure.
Figure 2:
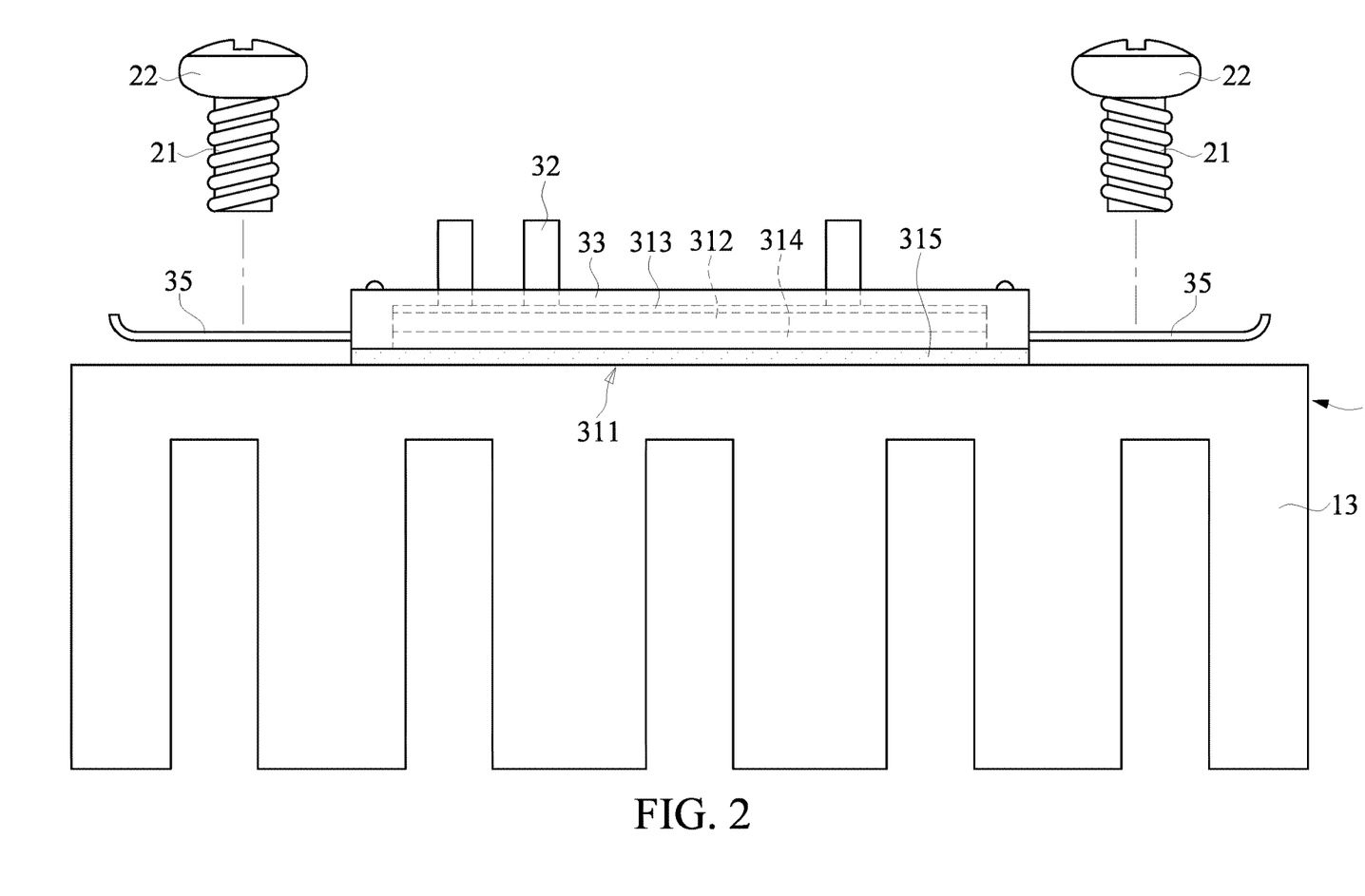
FIG. 2 is a schematic lateral exploded view of the power device according to the present disclosure.

As shown in FIG. 1 and FIG. 2, the power module 3 includes a substrate 31, a plurality of pins 32, a frame body 33, a package body 34, and two fixing structures 35. A side of the substrate 31 is provided with at least one electronic component 36, and another side of the substrate 31 is a heat dissipation surface 311 that is used for contacting the flat surface 11 of the heat dissipation component 1. The electronic component 36 can be, for example, a microprocessor (MPU), or an electronic component such as a metal oxide semiconductor (MOS), etc., but it is not meant to limit the scope of the present disclosure.

As shown in FIG. 1 and FIG. 2, the substrate 31 may include, for example, a ceramic substrate 312, a layout layer 313, a heat dissipation layer 314 and a temperature interface layer 315 (such as a thermal interface material layer). The layout layer 313 is provided on one side of the ceramic substrate 312, and the heat dissipation layer 314 is provided on another side of the ceramic substrate 312. The layout layer 313 is connected to the electronic components 36, and the layout layer 313 is connected to the plurality of pins 32. The heat dissipation layer 314 is connected to the temperature interface layer 315 on the side opposite to the connection to the ceramic substrate 312. The temperature interface layer 315 is exposed outside the bottom of the frame body 33, and the side of the temperature interface layer 315 opposite to the connection with the heat dissipation layer 314 is the heat dissipation surface 311. The heat dissipation layer 314 can be formed by, for example, a copper material, but the surface cannot be completely smooth. Therefore, by adding the temperature interface layer 315 between the heat dissipation layer 314 and the flat surface 11 of the heat dissipation component 1, the substrate 31 can be in close contact with the flat surface 11 of the heat dissipation component 1. The temperature interface layer 315 can be formed by, for example, thermal paste. By designing the substrate 31 to include various structural combinations, the heat energy generated during the operation of the power module 3 can be quickly transferred to the heat dissipating element 1.

Figure 3:
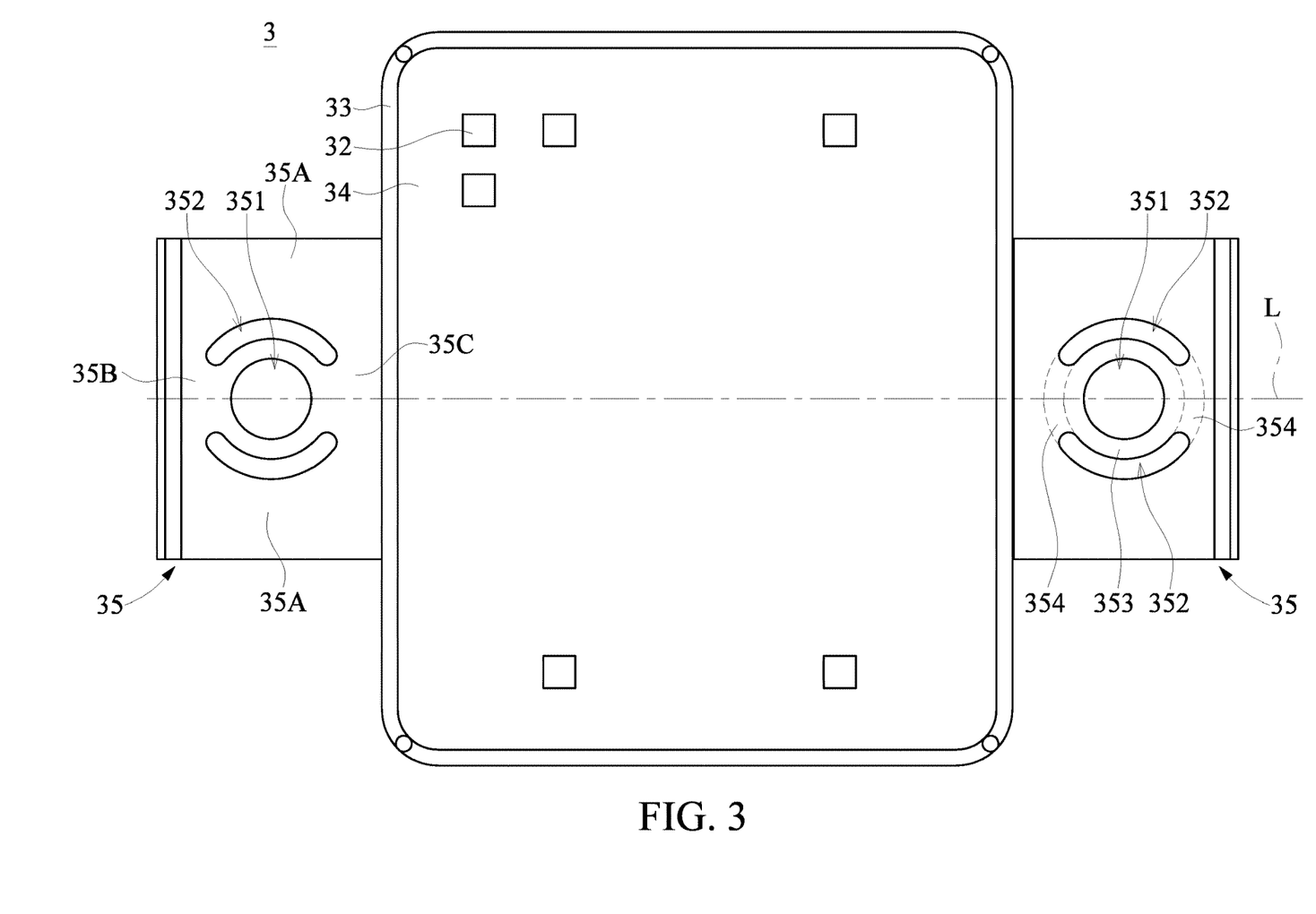
FIG. 3 is a schematic top view of a power module according to a first embodiment of the present disclosure.

FIG. 3 is a schematic top view of a power module according to a first embodiment of the present disclosure. As shown in FIG. 1 to FIG. 3, the package body 34 is disposed inside the frame body 33, the package body 34 can be used to cover the side of the substrate 31 that is provided with the electronic components 36, and the heat dissipation surface 311 on another side of the substrate 31 is exposed from the package body 34.

An end of each of the pins 32 is fixed to the side of the substrate 31 that is provided with the electronic components 36, and another end of each of the pins 32 passes through the package body 34 and is exposed outside the package body 34. Each pin 32 protrudes from another end of the package body 34 for electrically connecting with other circuit boards and the like. The number of the pins 32 included in the power module 3 and the position of each pin 32 on the substrate 31 can be designed according to the different requirements, but it is not meant to limit the scope of the present disclosure.

Figure 4:
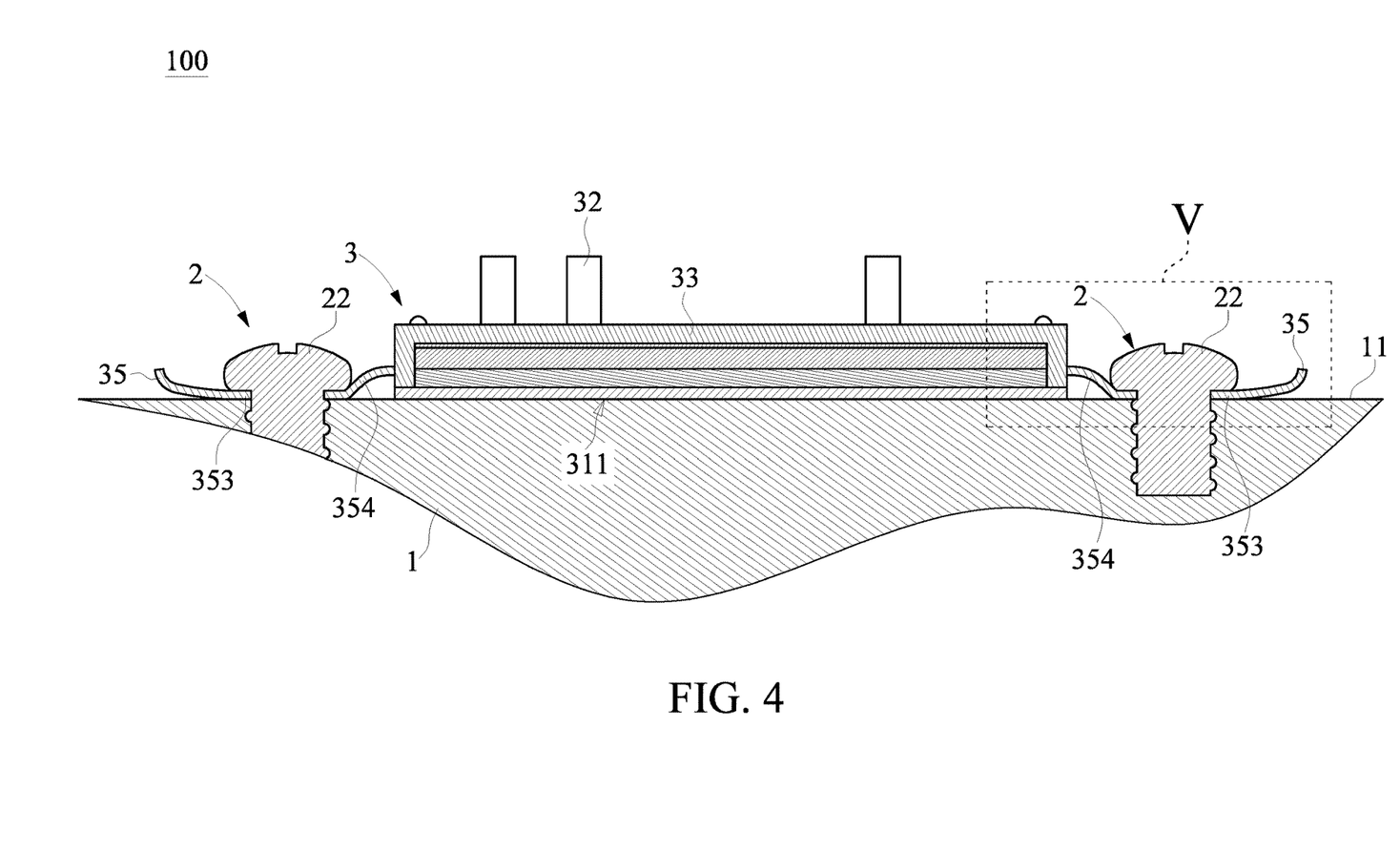
FIG. 4 is a schematic cross-sectional view of the power device according to the present disclosure.

As shown in FIG. 3, the two fixing structures 35 and the frame body 33 can be integrally formed, and both can be made of the same metal material (e.g., a material with stress such as aluminum). The two fixing structures 35 are respectively located on two opposite sides of the frame body 33, and the two fixing structures 35 are also respectively located on two opposite sides of the package body 34. As shown in FIG. 2, each fixing structure 35 is not flush with the heat dissipation surface 311, and there is a height difference between each fixing structure 35 and the heat dissipation surface 311. As shown in FIG. 2 and FIG. 4, when the fixing structure 35 is combined with the frame body 33 by the screws 2, the parts of the two fixing structures 35 close to the package body 34 can be maintained in a suspended state. In this way, the material stress and angle of the fixing structure 35 can be controlled to maintain a higher and more stable locking effect. In practical applications, the frame body 33 can be fixed to the periphery of the substrate 31 first, and then the liquid encapsulant (colloid) is injected into the cavity formed between the frame body 33 and the substrate 31. Finally, after the encapsulant is cured, the package body 34 can be formed in the cavity that is formed by the frame body 33 and the substrate 31.

According to the above, the package body 34 can be formed by making the frame body 33 and the two fixing structures 35 integrally formed, and by injecting the liquid encapsulant into the groove that is formed by the frame body 33 and the substrate 31, the overall manufacturing cost of the power module 3 can be greatly reduced. Specifically, in the conventional manufacturing process of the power module, the package body is manufactured by using a mold, so that the cost of manufacturing the mold is required in the manufacturing cost of the conventional power module. In addition, in practice, the setting positions of multiple pins on the substrate need to be adjusted according to the requirements of different products or customers, so that relevant manufacturers must set up different molds according to different products, and the manufacturing cost of the module cannot be reduced. On the other hand, in the power module 3 of the present disclosure, the manufacturing cost of the power module 3 is basically not affected through the design of the frame body 33 regardless of the setting position of the pins 32.

In practical applications, the frame body 33 and the two fixing structures 35 can be made of metal. Preferably, the frame body 33 and each fixing structure 35 can also be made of materials with high thermal conductivity, and a part of the heat energy generated during the operation of the power module 3 can also be transferred to the heat dissipation component 1 through the frame body 33 and the two fixing structures 35, or directly transferred to the air.

As shown in FIG. 3, each of the two fixing structures 35 includes a first through hole 351, at least two second through holes 352, an annular structure 353, and two sinking structures 354 (or two downward structures). In order to clearly indicate the specific regions of the sinking structures 354, the boundaries of the sinking structures 354 are marked with imaginary lines in FIG. 3. In practice, the two fixing structures 35 can be identical. In this way, when the power module 3 is fixed to the flat surface 11 of the heat dissipation component 1 by the two screws 2, the heat dissipation surface 311 of the substrate 31 can be better flatly attached to the flat surface 11 of the heat dissipation component 1 (i.e., the heat dissipation surface 311 of the substrate 31 can be flattened relative to the flat surface 11 of the heat dissipation component 1).

The first through hole 351 passes through the fixing structure 35, and the first through hole 351 can be passed by a screw 2. Each of the first through holes 351 can be round holes, but not limited to this. The at least two second through holes 352 pass through the fixing structure 35, the at least two second through holes 352 are centered on the first through hole 351 and are respectively located beside two sides of the first through hole 351, and the at least two second through holes 352 face each other. Each of the two second through holes 352 is arc-shaped, and each of the second through holes 352 is disposed around a part of the outer edge of the first through hole 351. In practice, each second through hole 352 can be arc-shaped, and the center of each arc-shaped second through hole 352 overlaps with the center of the circular first through hole 351.

The annular structure 353 is located among the two second through holes 352 and the first through holes 351. The outer diameter of each annular structure 353 can be approximately equal to the outer diameter of the head portion 22 of each screw 2. The two sinking structures 354 are respectively located on both sides of the annular structure 353, each sinking structure 354 is connected to the annular structure 353, and a sinking structure 534 is formed between one end of each second through hole 352 and one end of another second through hole 352.

Figure 5:
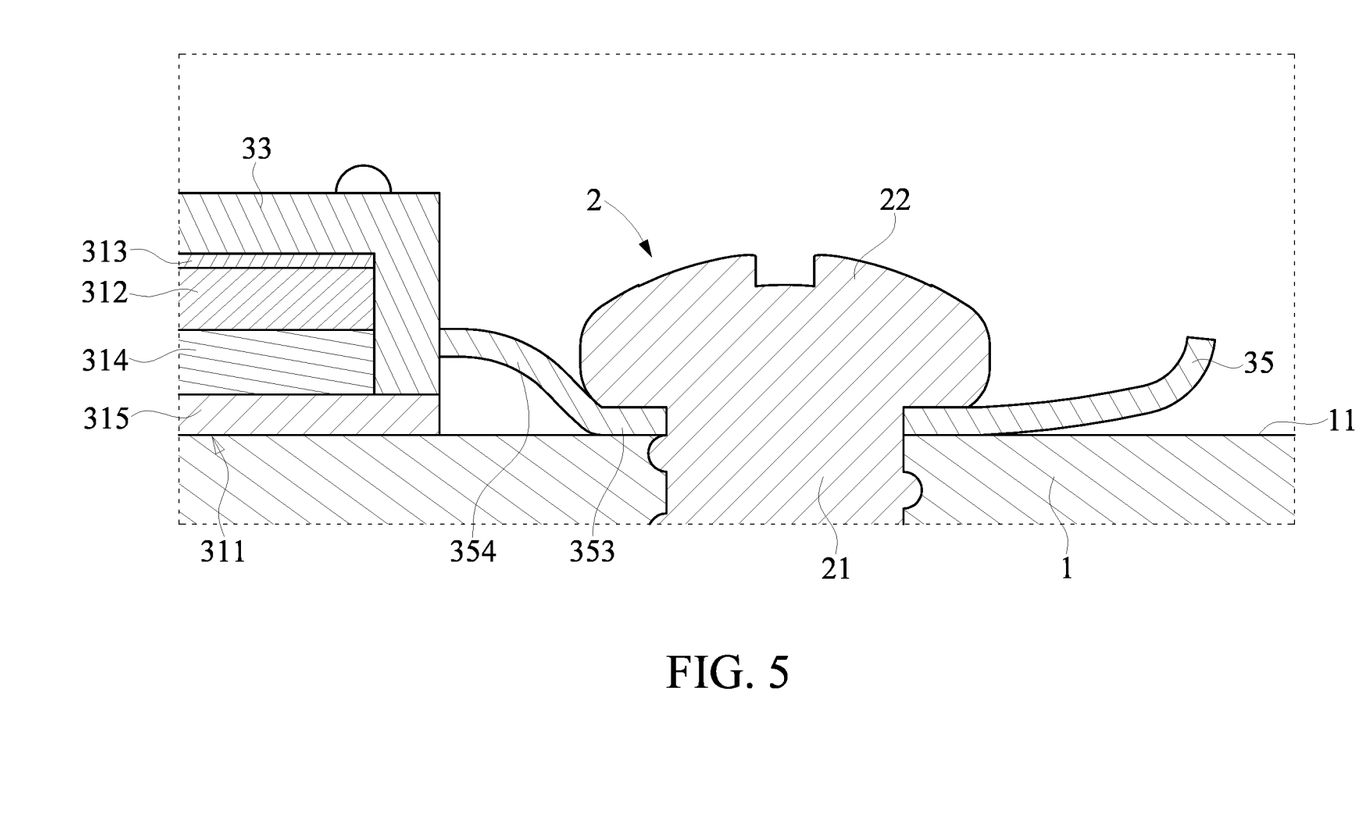
FIG. 5 is a partial schematic enlarged view of FIG. 4.

FIG. 4 is a schematic cross-sectional view of the power device according to the present disclosure, and FIG. 5 is a partial schematic enlarged view of FIG. 4. As shown in FIG. 1, FIG. 3, FIG. 4 and FIG. 5, when the power module 3 is fixed to the heat dissipation component 1 by two screws 2, a stud portion 21 of each of the screws 2 can pass through the corresponding first through hole 351, and a head portion 22 of each of the screws 2 can press against the corresponding annular structure 353, so that one side of the annular structure 353 can be flatly attached to the flat surface 11 of the heat dissipation component 1, and the two sinking structures 354 that are respectively connected with the two annular structure 353 can be bent toward the flat surface 11 of the heat dissipation component 1 and generate a downward applied force, thereby the heat dissipation surface 311 is more stably and flatly attached to the flat surface 11 of the heat dissipation component 1. The outer diameter of each annular structure 353 is approximately equal to the outer diameter of the head portion 22 of each screw 2.

According to the above, by virtue of the first through hole 351, the two second through holes 352, the annular structure 353 and the two sinking structures 354 provided by the power module 3 of the present disclosure, when the fixing structure 35 is fixed to the heat dissipation component 1 through the screws 2, the two sinking structures 354 are bent toward the direction facing the flat surface 11 of the heat dissipation component 1, so that the annular structure 353 can be more stably and flatly attached to the flat surface 11 of the heat dissipation component 1 by the locking of the head portion 22 of the corresponding screw 2, it is not easy to form a gap between the annular structure 353 and the heat dissipation component 1, and it is not easy to form a gap between the annular structure 353 and the head portion 22 of the screw 2. In this way, the stability of the power module 3, the two screws 2 and the heat dissipation component 1 can be greatly improved.

In practice, the power device 100 may be installed in a vibrating environment (for example, the power device 100 may be installed on a vehicle) depending on different products to be installed. Therefore, if and when the screws 2 cannot make the relevant structure (such as the two sinking structures 354) tightly and flatly attached to the flat surface 11 of the heat dissipation component 1, and the power device 100 is in a vibration environment, it is not easy to form a gap between the screw 2 and the fixing structure 35. As described above, if the heat dissipation surface 311 of the power module 3 is not tightly and flatly attached to the flat surface 11 of the heat dissipation component 1, a large amount of heat energy generated during the operation of the power module 3 cannot be effectively transferred out through the heat dissipation component 1. For the above reasons, the operation efficiency of the power module 3 would be reduced, or even the power module 3 would be destroyed.

It should be emphasized that the two sinking structures 354 are arranged facing each other. Therefore, in the process of locking the stud portion 21 of each screw 2 with the screw hole 12 of the heat dissipation component 1, the annular structure 353 can smoothly sink toward the flat surface 11 of the heat dissipation component 1, so that the annular structure 353 can be flatly attached to the flat surface 11 of the heat dissipation component 1.

In the power device 100 of the present disclosure, by virtue of the design of the two sinking structures 354, each section of the annular structure 353 can bear approximately the same downward force, so that the annular structure 353 can not only be effectively pushed by the screws 2 and flatly attached to the flat surface 11 of the heat dissipation component 1, but also when the power module 3 is in a vibration environment, it is not easy to form a gap between the annular structure 353 and the heat dissipation component 1.

In addition, the main function of the two fixing structures 35 is to use the two screws 2 to fix the power module 3 on the flat surface 11 of the heat dissipation component 1. Therefore, when the two screws 2 are used to lock the power module 3 to the flat surface 11 of the heat dissipation component 1, not only each annular structure 353 can be flatly attached to the flat surface 11 of the heat dissipation component 1, but also the locking force provided by the two screws 2 applied to the heat dissipation component 1 can be effectively transmitted to the power module 3 through the two fixing structures 35, so that the heat dissipation surface 311 of the power module 3 can be flatly attached to the flat surface 11 of the heat dissipation component 1. Therefore, the heat energy generated during the operation of the power module 3 can be effectively transferred out through the heat dissipation component 1.

As shown in FIG. 3, in a preferred embodiment, the first through hole 351 of the power module 3 of the present disclosure is a circular hole, and the center of each first through hole 351 is located on the same axis L, and a part of each sinking structure 354 is located on the axis L, and the fixing structure 35 is divided into two first outer connecting parts 35A, a second outer connecting part 35B and an inner connecting portion 35C by each first through hole 351 and the two adjacent second through holes 352. The first outer connecting portion 35A is located on the side of the second through hole 352 opposite to the first through hole 351, the second outer connecting portion 35B is located on the side of the first through hole 351 away from the package body 34, and the inner connecting portion 35C is located between the first through hole 351 and the package body 34. When the power module 3 is fixed to the heat dissipation component 1 through the two screws 2 (as shown in FIG. 1), the sinking structure 354 away from the package body 34 can be connected to the package body 34 through the second outer connecting portion 35B and the two first outer connecting parts 35A, and the sinking structure 354 close to the package body 34 can be connected to the package body 34 through the inner connecting portion 35C, so that the heat dissipation surface 311 of the substrate 31 in the package body 34 can be closely and flatly attached to the flat surface 11 of the heat dissipation component 1 by the cooperation of the fixing structures 35 and the screws 2 (as shown in FIG. 1).

One side of each annular structure 353 is flatly attached to the flat surface 11 of the heat dissipation component 1, and the heat dissipation surface 311 of the heat dissipation component 1 is also closely and flatly attached to the flat surface 11 of the heat dissipation component 1, and each section of the annular structure 353 can bear approximately the same downward force. Therefore, when the power module 3 is in a vibration environment, it is not easy to form a gap between each annular structure 353 and the heat dissipation component 1. When the power module 3 is in a normal vibration environment, each annular structure 353 and the heat dissipation surface 311 can still be flatly attached to the flat surface 11 of the heat dissipation component 1.

Figure 6:
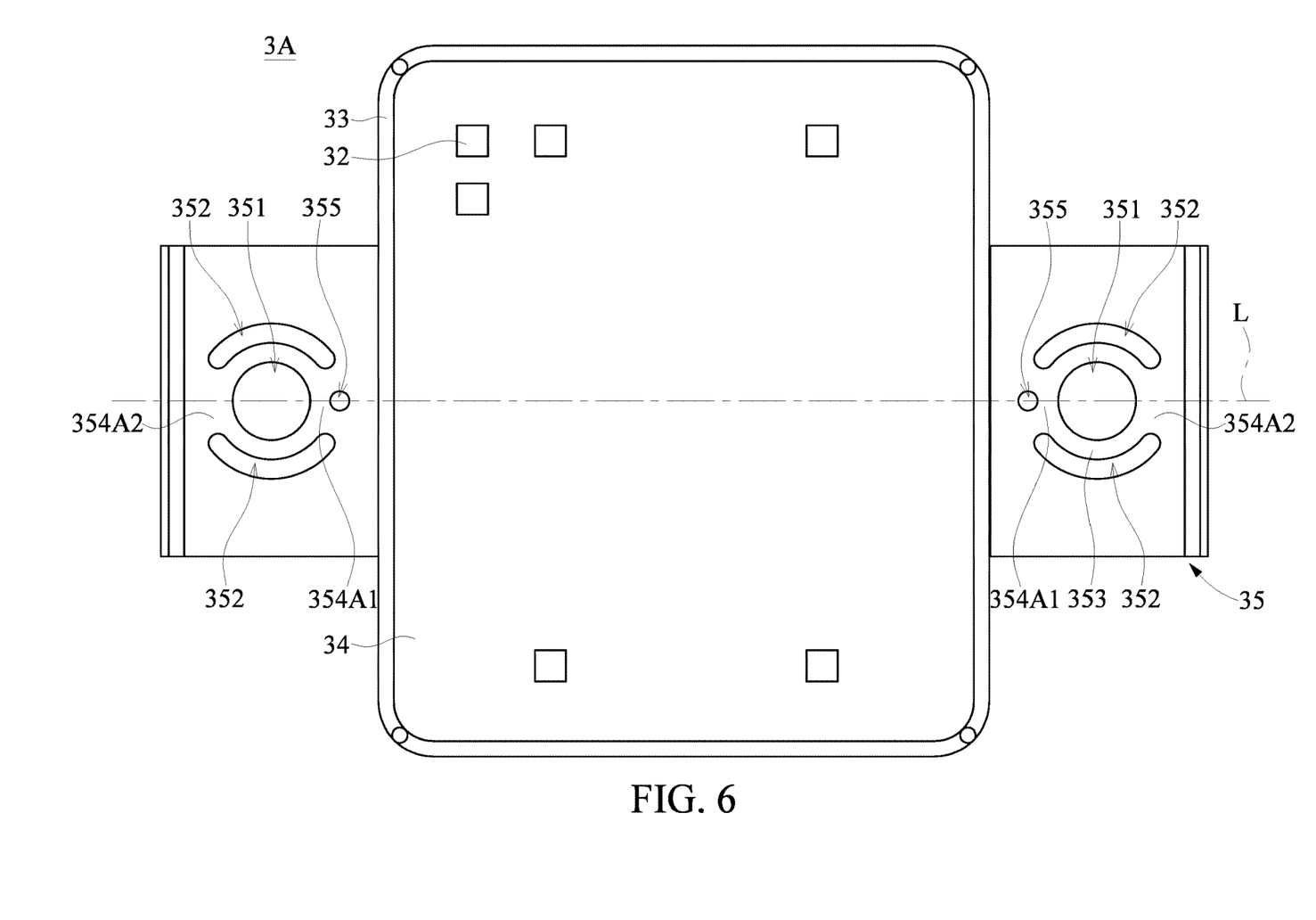
FIG. 6 is a schematic top view of the power module according to a second embodiment of the present disclosure.

Referring to FIG. 6, which is a schematic top view of the power module according to a second embodiment of the present disclosure. This embodiment has the same features as the previous embodiment, which will not be repeated below. The main difference between this embodiment and the previous embodiment is as follows: the two sinking structures 354 of each fixing structure 35A of the power module 3A of this embodiment are respectively defined as an inner sinking structure 354A1 and an outer sinking structure 354A2, the inner sinking structure 354A1 is disposed close to the package body 34, and the outer sinking structure 354A2 is disposed away from the package body 34. Each of the two fixing structures 35A further includes an auxiliary through hole 355, the auxiliary through hole 355 passes through the fixing structure 35A, the auxiliary through hole 355 is located between the inner sinking structure 354A1 and the package body 34, a hole diameter of the auxiliary through hole 355 is smaller than a hole diameter of the first through hole 351, and a center of the auxiliary through hole 355 is located on the axis L. In the drawings of this embodiment, each auxiliary through hole 355 is a circular hole as an example, but the shape of each auxiliary through hole 355 is not limited.

The structural strength of each fixed structure 35A in the surrounding area of the inner sinking structure 354A1 can be weakened through the auxiliary through hole 355. When the power module 3 is in a high vibration frequency environment, the stress on the fixed structure 35A is easily concentrated around the auxiliary through hole 355. Therefore, if each fixed structure 35A receives vibration energy exceeding the original design, the fixed structure 35A will preferentially be broken from the periphery of the auxiliary hole 355, and the power module 3 can still be used continuously for a period of time.

Figure 7:
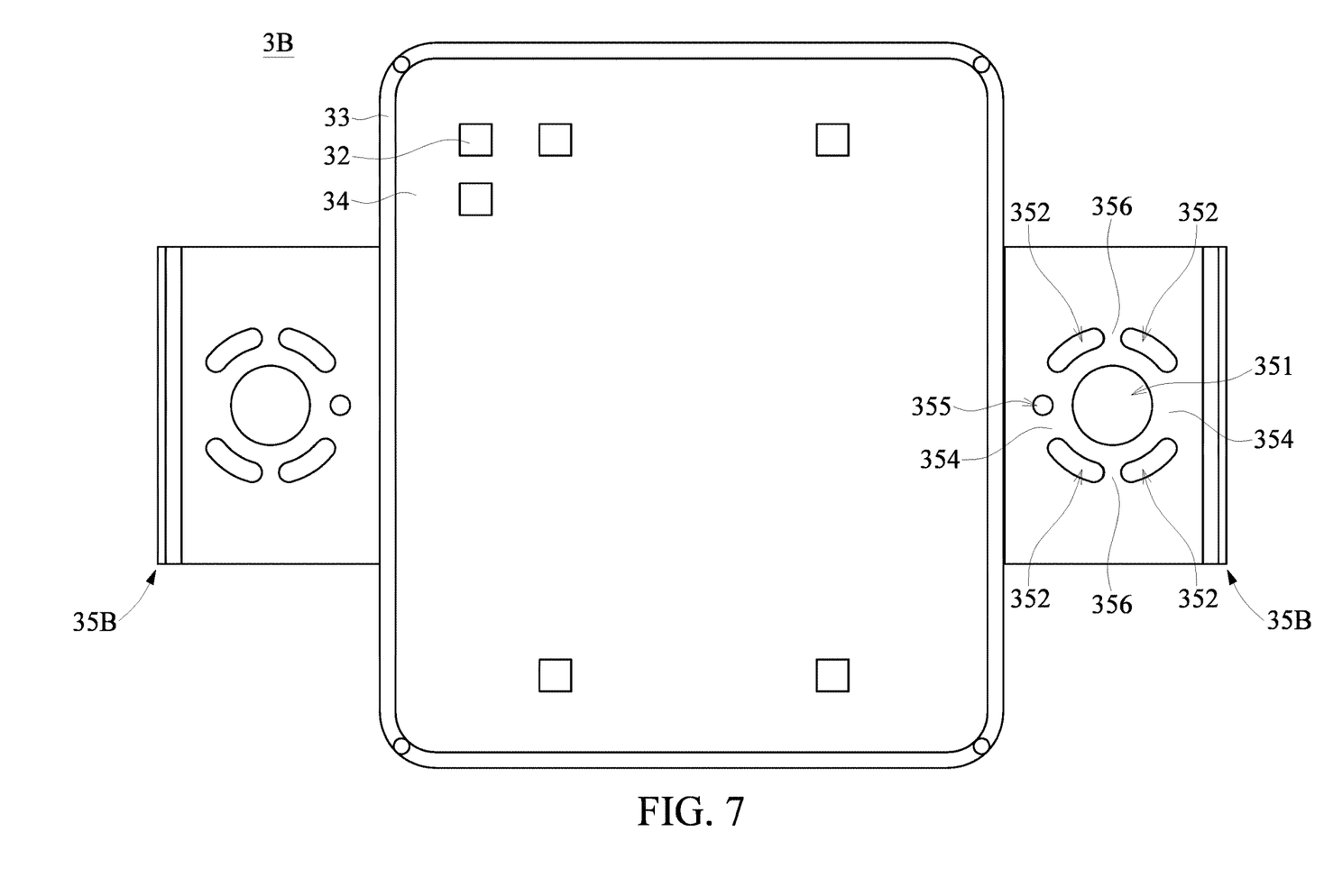
FIG. 7 is a schematic top view of the power module according to a third embodiment of the present disclosure.

Referring to FIG. 7, which is a schematic top view of the power module according to a third embodiment of the present disclosure. This embodiment has the same features as the previous embodiment, which will not be repeated below. The main difference between this embodiment and the previous embodiment is as follows: each fixing structure 35B of the power module 3B of this embodiment includes four second through holes 352. Two of the second through holes 352 are arranged beside a side of the first through hole 351, and another two of the second through holes 352 are arranged beside another side of the first through hole 351, a weakened structure 356 is formed between the two second through holes 352 located on the same side, and another weakened structure 356 is formed between the another two second through holes 352 located on another same side. When the power module 3 is fixed to the heat dissipation component 1 by the two screws 2, the two weakened structures 356 are crushed and broken by the two screws 2.

Figure 8:
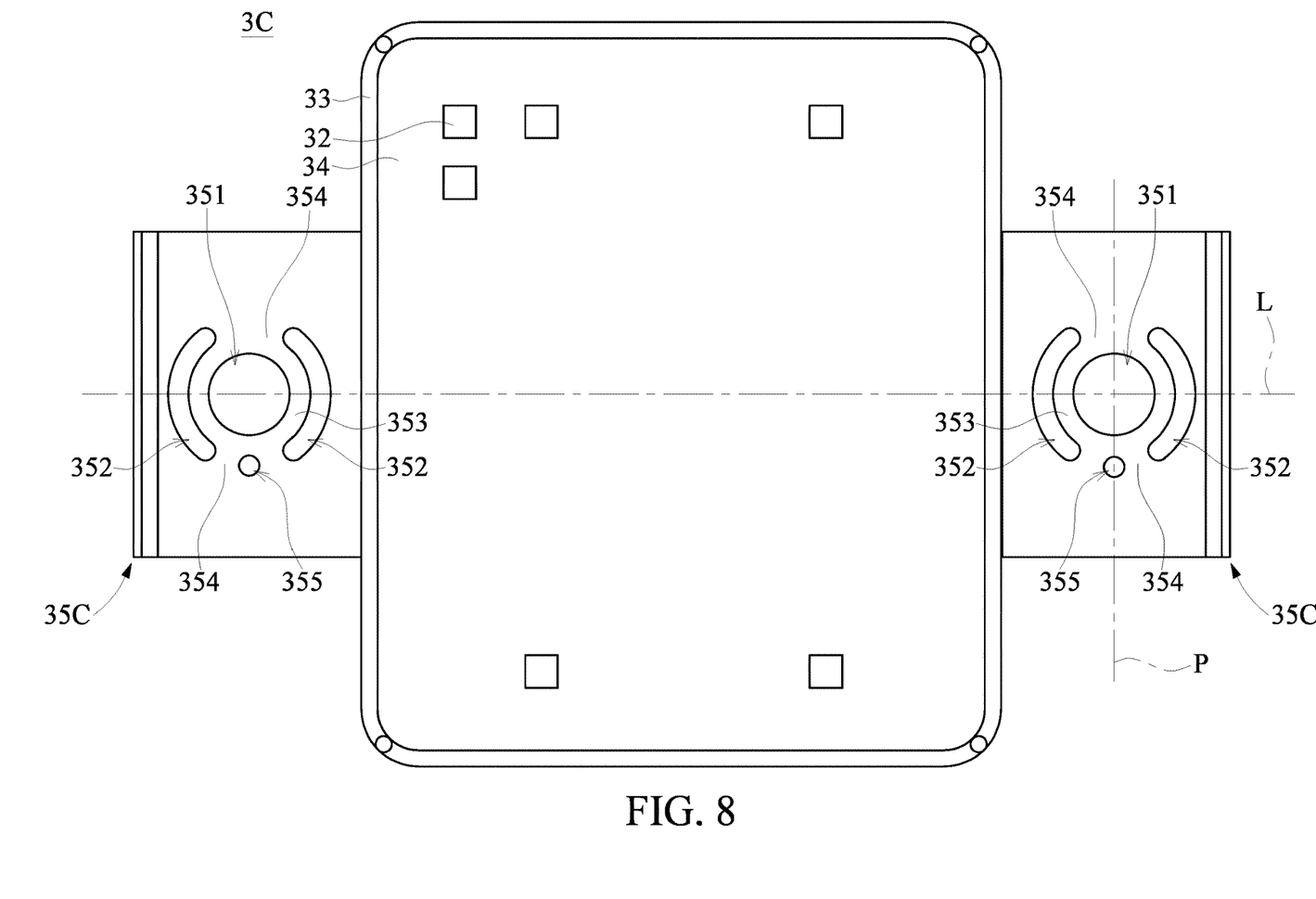
FIG. 8 is a schematic top view of the power module according to a fourth embodiment of the present disclosure.

Referring to FIG. 8, which is a schematic top view of the power module according to a fourth embodiment of the present disclosure. This embodiment has the same features as the previous embodiment, which will not be repeated below. The main difference between this embodiment and the previous embodiment is as follows: the two first through holes 351 of each fixing structure 35C of the power module 3C of the present embodiment are located on an axis L, any part of the two sinking structures 354 are not located on the axis L, the two sinking structures 354 of each of the two fixing structures 35C are partially located on a longitudinal line P, and the longitudinal line P is not parallel to the axis L. In practical applications, the longitudinal line P may be perpendicular to the axis L.

Each of the two fixing structures 35C further includes an auxiliary through hole 355, the auxiliary through hole 355 is disposed adjacent to one of the sinking structures 354, and a hole diameter of the auxiliary through hole 355 is smaller than a hole diameter of the first through hole 351. In a variant embodiment of the present disclosure, each fixing structure 35C may not include the auxiliary through hole 355.

Figure 9:
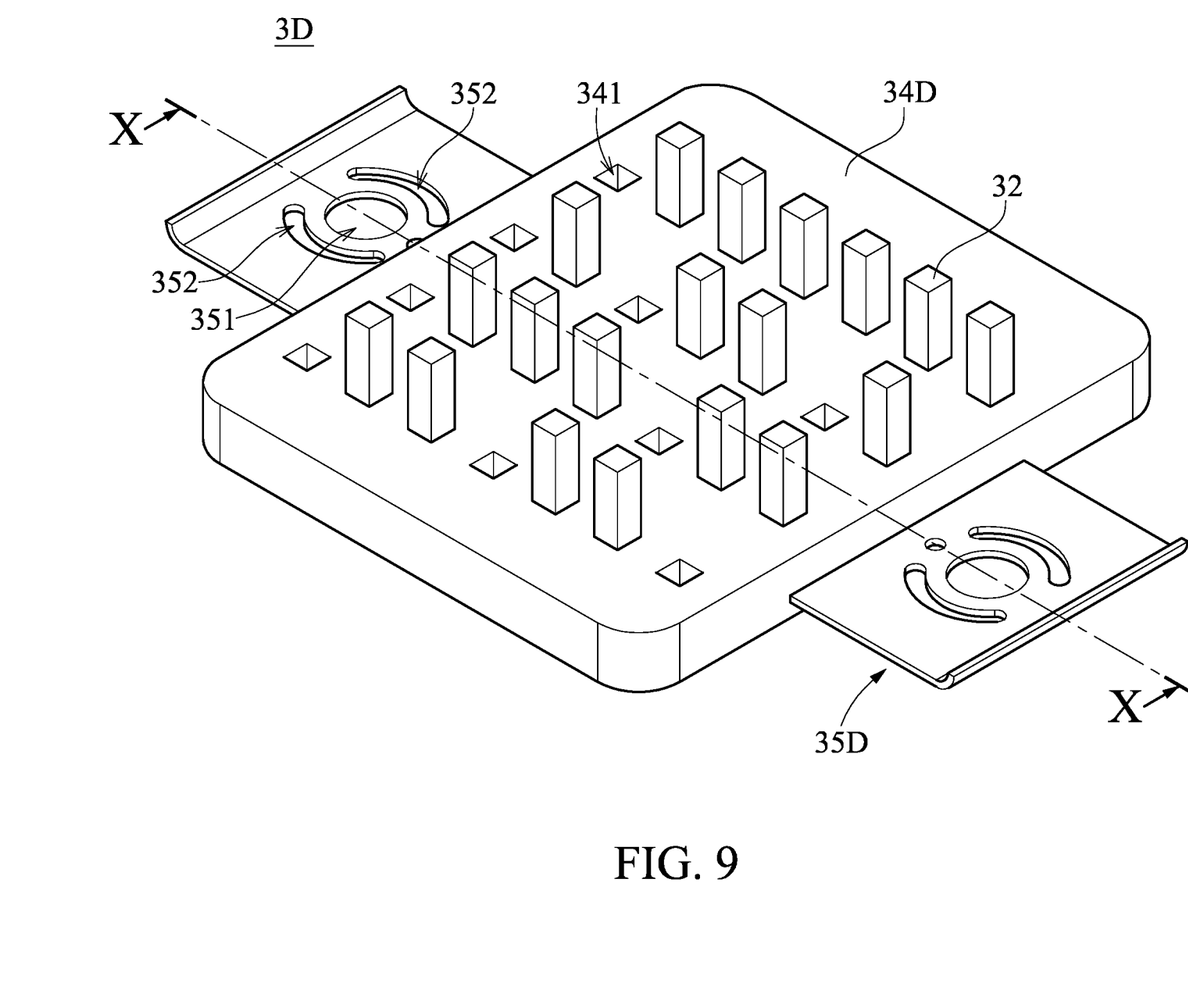
FIG. 9 is a schematic top view of the power module according to a fifth embodiment of the present disclosure.
Figure 10:
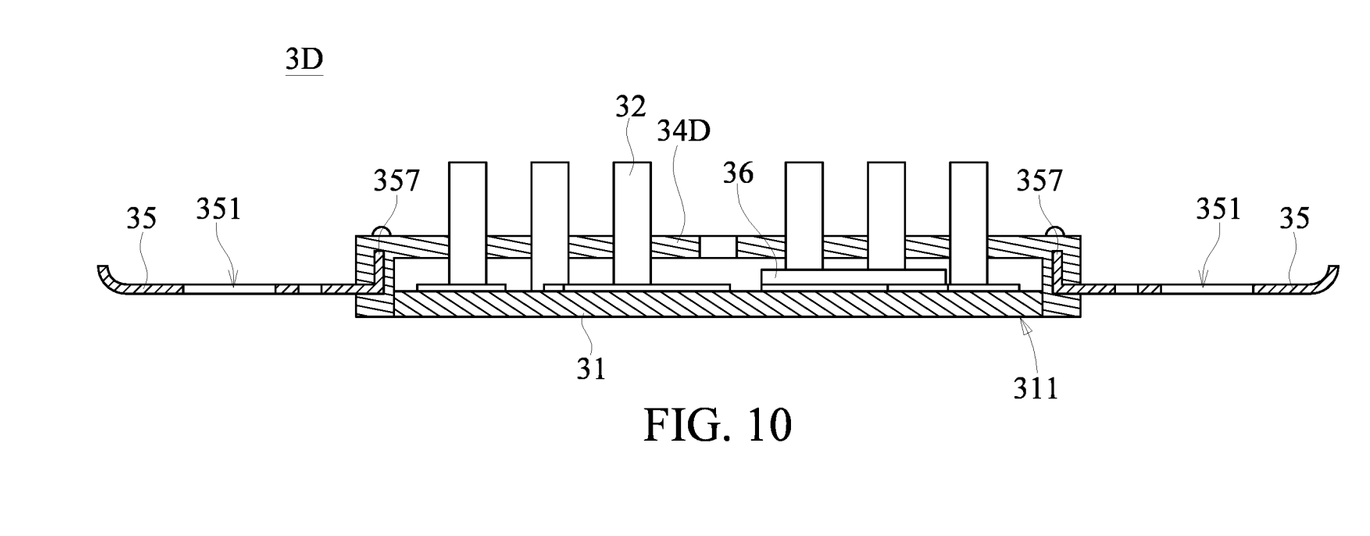
FIG. 10 is a schematic cross-sectional view taken along line X-X of FIG. 9.

Referring to FIG. 9 and FIG. 10, FIG. 9 is a schematic top view of the power module according to a fifth embodiment of the present disclosure, and FIG. 10 is a schematic cross-sectional view taken along line X-X of FIG. 9. The main difference between this embodiment and the previous embodiment is as follows: the package body 34D of the power module 3D of the present embodiment can be used to cover an inner fixing portion 357 of each fixing structure 35 and a part of each fixing structure 35D by injection molding, so as to be mutually fixed with the two fixing structures 35D. In addition, the package body 34D further includes a plurality of through holes 341, and a part of each pin 32 can pass through one of the through holes 341. In practical applications, the package body 34D can be fabricated by, for example, a related mold, but not limited to this.

Figure 11:
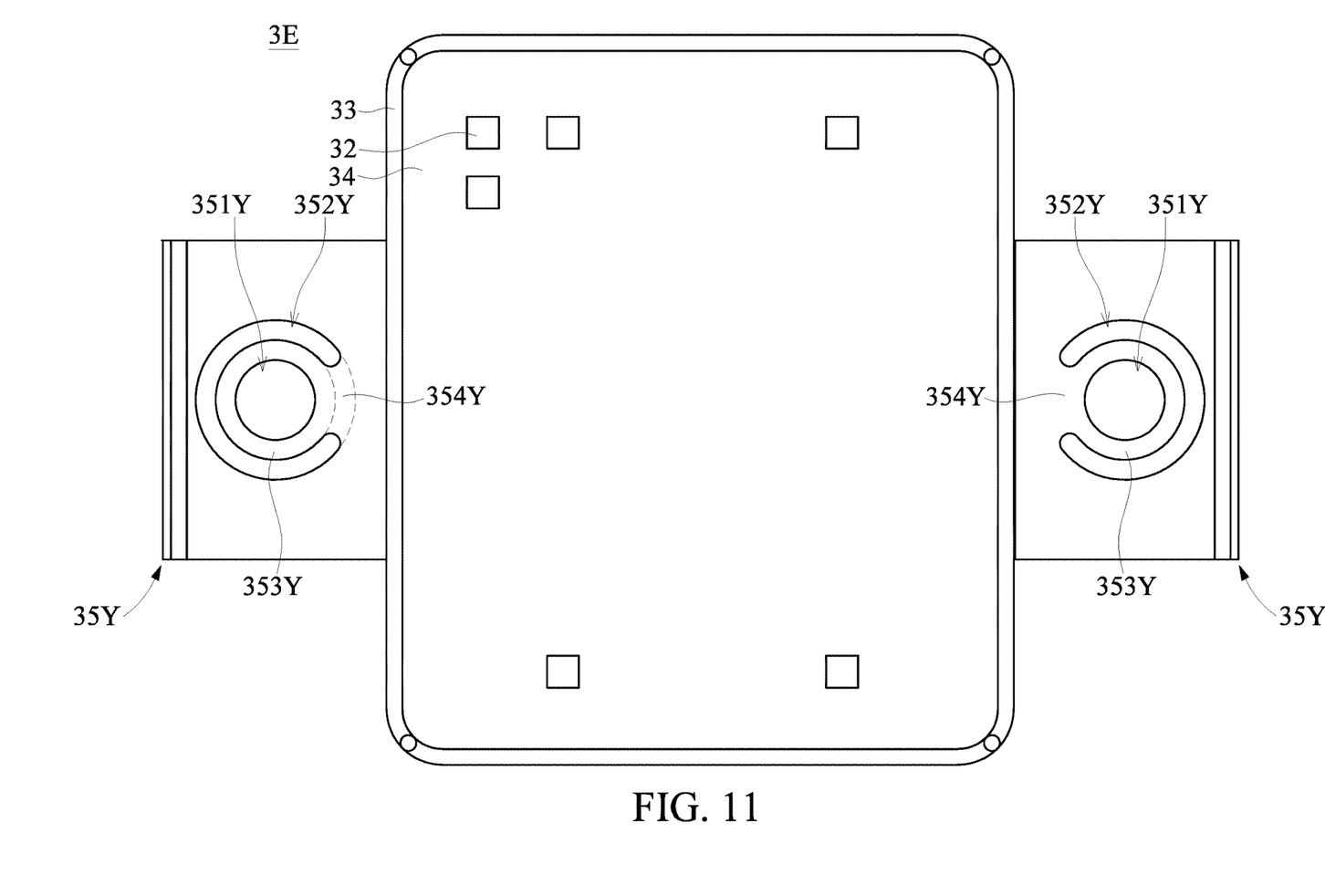
FIG. 11 is a schematic top view of the power module according to a sixth embodiment of the present disclosure.

Referring to FIG. 11, which is a schematic top view of the power module according to a sixth embodiment of the present disclosure. This embodiment has the same features as the previous embodiment, which will not be repeated below. The main difference between this embodiment and the previous embodiment is as follows: each fixing structure 35Y only includes a single second through hole 352Y and a single sinking structure 354Y. The second through hole 352Y is arc-shaped, and the second through hole 352Y is centered on the first through hole 351Y and is arranged around a part of a periphery of the first through hole 351Y. Each fixing structure 35Y has a first through hole 351Y, each second through hole 352Y is substantially disposed around the periphery of the first through hole 351Y An annular structure 353Y is formed between each first through hole 351Y and the second through hole 352Y, and the annular structure 353Y is connected to the sinking structure 354Y. The sinking structure 354Y is located between the package body 34 and the first through hole 351Y, and the second through hole 352Y does not exist between the package body 34 and the first through hole 351Y.

As shown in FIG. 1, when the power module 3C of this embodiment is fixed to the heat dissipation component 1 through two screws 2, a stud portion 21 of each of the screws 2 can pass through the corresponding first through hole 351Y, and a head portion 22 of each of the screws 2 can press against the corresponding annular structure 353Y, so that one side of the annular structure 353Y can be flatly attached to the flat surface 11 of the heat dissipation component 1, thereby a large amount of heat energy generated during the operation of the power module 3C can be effectively transferred out through the heat dissipation component 1. It should be noted that the power modules described in the previous embodiments can also be manufactured, implemented or sold separately, and the power modules in the embodiments are not limited to being manufactured, implemented and sold only with two screws and heat dissipation component.

In conclusion, in the power module and the power device provided by the present disclosure, when the power module is fixed to the heat dissipation component by two screws, the heat dissipation surface of the power module can be flatly attached to a flat surface of the heat dissipation component by virtue of the first through hole, the second through hole, the annular structure and the two sinking structures of each of the two fixing structures, so that a large amount of heat energy generated during the operation of the power module 3C can be effectively transferred out through the heat dissipation component. The power device and the power module of the present disclosure have a relatively long service life in the relevant vibration test or vibration environment.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module, comprising:
    a substrate, wherein a side of the substrate is provided with at least one electronic component, and another side of the substrate is a heat dissipation surface;
    a package body covering the side of the substrate that is provided with the at least one electronic component, and the heat dissipation surface being exposed from the package body;
    a plurality of pins, wherein an end of each of the pins is fixed to the substrate, and another end of each of the pins passes through the package body; and
    two fixing structures respectively disposed at two opposite sides of the package body, wherein each of the two fixing structures includes:
        a first through hole passing through the fixing structure;
        at least two second through holes passing through the fixing structure, wherein the at least two second through holes are centered on the first through hole and are respectively located beside two sides of the first through hole, the at least two second through holes face each other, and each of the two second through holes is arc-shaped;
        an annular structure disposed among the at least two second through holes and the first through hole; and
        two sinking structures respectively disposed on two sides of the annular structure, wherein each of the sinking structures is connected to the annular structure, and one of the two sinking structures is disposed between an end of one of the two second through holes and an end of another one of the two second through holes;
    wherein, when the power module is fixed to a heat dissipation component by two screws, a stud portion of each of the screws passes through the corresponding first through hole, and a head portion of each of the screws presses against the corresponding annular structure, so that the annular structure is flatly attached to a flat surface of the heat dissipation component.

2. The power module according to claim 1, wherein the first through hole of each of the two fixing structures is a circular hole, a center of the first through hole of each of the two fixing structures is located on a same axis, and each of the sinking structures is located on the same axis.

3. The power module according to claim 2, wherein the two sinking structures of each of the two fixing structures are respectively defined as an inner sinking structure and an outer sinking structure, the inner sinking structure is disposed close to the package body, and the outer sinking structure is disposed away from the package body; wherein each of the two fixing structures further includes an auxiliary through hole, the auxiliary through hole passes through the fixing structure, the auxiliary through hole is located between the inner sinking structure and the package body, a hole diameter of the auxiliary through hole is smaller than a hole diameter of the first through hole, and a center of the auxiliary through hole is located on the axis.

4. The power module according to claim 3, wherein each of the two fixing structures includes another two second through holes, the two second through holes are arranged beside a side of the first through hole, and the another two second through holes are arranged beside another side of the first through hole, a weakened structure is formed between the two second through holes, and another weakened structure is formed between the another two second through holes; wherein, when the power module is fixed to the heat dissipation component by the two screws, the two weakened structures are crushed and broken by the two screws.

5. The power module according to claim 1, wherein the power module further comprises a frame body, the frame body is disposed around the package body, and the frame body is integrally formed with the two fixing structures.

6. The power module according to claim 1, wherein each of the two fixing structures includes an inner fixing portion, the package body is fixed to the two fixing structures by means of injection molding, and the inner fixing portion of each of the two fixing structures is covered by the package body.

7. The power module according to claim 1, wherein the two first through holes are located on an axis, the two sinking structures of each of the two fixing structures are not located on the axis, the two sinking structures of each of the two fixing structures are located on a longitudinal line, and the longitudinal line is not parallel to the axis; wherein each of the two fixing structures further includes an auxiliary through hole, the auxiliary through hole is disposed adjacent to one of the sinking structures, and a hole diameter of the auxiliary through hole is smaller than a hole diameter of the first through hole.

8. A power module, comprising:
    a substrate, wherein a side of the substrate is provided with at least one electronic component, and another side of the substrate is a heat dissipation surface;
    a package body covering the side of the substrate that is provided with the at least one electronic component, and the heat dissipation surface being exposed from the package body;
    a plurality of pins, wherein an end of each of the pins is fixed to the substrate, and another end of each of the pins passes through the package body; and two fixing structures respectively disposed at two opposite sides of the package body, wherein each of the two fixing structures includes:
- a first through hole passing through the fixing structure;
- a second through holes passing through the fixing structure, wherein the second through hole is arc-shaped, and the second through hole is centered on the first through hole and is arranged around a part of a periphery of the first through hole;
- an annular structure disposed between the second through hole and the first through hole; and
- a sinking structure disposed on a side of the annular structure, wherein the sinking structure is disposed between the package body and the first through hole, and the sinking structure is connected to the annular structure;

wherein, when the power module is fixed to a heat dissipation component by two screws, a stud portion of each of the screws passes through the corresponding first through hole, and a head portion of each of the screws presses against the corresponding annular structure, so that the annular structure is flatly attached to a flat surface of the heat dissipation component.

9. A power device, comprising:
- a heat dissipation component;
- two screws; and
- a power module including:
  - a substrate, wherein a side of the substrate is provided with at least one electronic component, and another side of the substrate is a heat dissipation surface;
  - a package body covering the side of the substrate that is provided with the at least one electronic component, and the heat dissipation surface being exposed from the package body;
  - a plurality of pins, wherein an end of each of the pins is fixed to the substrate, and another end of each of the pins passes through the package body; and
  - two fixing structures respectively disposed at two opposite sides of the package body, wherein each of the two fixing structures includes:
    - a first through hole passing through the fixing structure;
    - at least two second through holes passing through the fixing structure, wherein the at least two second through holes are centered on the first through hole and are respectively located beside two sides of the first through hole, the at least two second through holes face each other, and each of the two second through holes is arc-shaped;
    - an annular structure disposed among the at least two second through holes and the first through hole; and
    - two sinking structures respectively disposed on two sides of the annular structure, wherein each of the sinking structures is connected to the annular structure, and one of the two sinking structures is disposed between an end of one of the two second through holes and an end of another one of the two second through holes;

wherein, when the power module is fixed to the heat dissipation component by the two screws, a stud portion of each of the two screws passes through the corresponding first through hole, and a head portion of each of the screws presses against the corresponding annular structure, so that the annular structure is flatly attached to a flat surface of the heat dissipation component.

10. The power device according to claim 9, wherein the first through hole of each of the two fixing structures is a circular hole, a center of the first through hole of each of the two fixing structures is located on a same axis, and each of the sinking structures is located on the same axis.

11. The power device according to claim 10, wherein the two sinking structures of each of the two fixing structures are respectively defined as an inner sinking structure and an outer sinking structure, the inner sinking structure is disposed close to the package body, and the outer sinking structure is disposed away from the package body; wherein each of the two fixing structures further includes an auxiliary through hole, the auxiliary through hole passes through the fixing structure, the auxiliary through hole is located between the inner sinking structure and the package body, a hole diameter of the auxiliary through hole is smaller than a hole diameter of the first through hole, and a center of the auxiliary through hole is located on the axis.

12. The power device according to claim 11, wherein each of the two fixing structures includes another two second through holes, the two second through holes are arranged beside a side of the first through hole, and the another two second through holes are arranged beside another side of the first through hole, a weakened structure is formed between the two second through holes, and another weakened structure is formed between the another two second through holes; wherein, when the power module is fixed to the heat dissipation component by the two screws, the two weakened structures are crushed and broken by the two screws.

13. The power device according to claim 9, wherein the power module further comprises a frame body, the frame body is disposed around the package body, and the frame body is integrally formed with the two fixing structures.

14. The power device according to claim 9, wherein each of the two fixing structures includes an inner fixing portion, the package body is fixed to the two fixing structures by means of injection molding, and the inner fixing portion of each of the two fixing structures is covered by the package body.

15. The power device according to claim 9, wherein the two first through holes are located on an axis, the two sinking structures of each of the two fixing structures are not located on the axis, the two sinking structures of each of the two fixing structures are located on a longitudinal line, and the longitudinal line is not parallel to the axis; wherein each of the two fixing structures further includes an auxiliary through hole, the auxiliary through hole is disposed adjacent to one of the sinking structures, and a hole diameter of the auxiliary through hole is smaller than a hole diameter of the first through hole.

* * * * *